United States Patent
Conrow et al.

(10) Patent No.: US 9,024,665 B2
(45) Date of Patent: May 5, 2015

(54) TRANSMITTER WITH VOLTAGE AND CURRENT MODE DRIVERS

(71) Applicant: Intel Corporation, Santa Clara, CA (US)

(72) Inventors: Derek M. Conrow, Sherwood, OR (US); Aaron Martin, El Dorado Hills, CA (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/801,759

(22) Filed: Mar. 13, 2013

(65) Prior Publication Data

US 2014/0266320 A1 Sep. 18, 2014

(51) Int. Cl.
*H03K 3/00* (2006.01)
*H04B 1/04* (2006.01)

(52) U.S. Cl.
CPC .................................. *H04B 1/0475* (2013.01)

(58) Field of Classification Search
None
See application file for complete search history.

(56) References Cited

U.S. PATENT DOCUMENTS

| | | | | |
|---|---|---|---|---|
| 6,665,347 | B2 * | 12/2003 | van Bavel et al. | 375/257 |
| 6,704,818 | B1 * | 3/2004 | Martin et al. | 710/100 |
| 7,643,563 | B2 * | 1/2010 | Huang et al. | 375/257 |
| 7,817,727 | B2 * | 10/2010 | Kumar et al. | 375/258 |
| 7,977,981 | B2 * | 7/2011 | Wilson et al. | 327/108 |
| 8,384,444 | B1 * | 2/2013 | Lucero et al. | 327/108 |
| 8,548,070 | B2 * | 10/2013 | Nishioka et al. | 375/257 |
| 2003/0189441 | A1 * | 10/2003 | Nguyen et al. | 326/30 |
| 2010/0164539 | A1 * | 7/2010 | Balamurugan et al. | 326/30 |

* cited by examiner

*Primary Examiner* — Lincoln Donovan
*Assistant Examiner* — Khareem E Almo
(74) *Attorney, Agent, or Firm* — Green, Howard & Mughal, LLP

(57) ABSTRACT

Described is an integrated circuit (IC) which comprises: an input-output (I/O) pad for coupling to a transmission line; a voltage mode driver coupled to the I/O pad, the voltage mode driver having a pull-up driver and a pull-down driver; and a current mode driver coupled to the I/O pad, the current mode driver operable to function in parallel to the voltage mode driver.

18 Claims, 6 Drawing Sheets

TRANSMITTER WITH VOLTAGE AND CURRENT MODE DRIVERS

BACKGROUND

Voltage mode (V-mode) input-output (I/O) transmitters are more popular for low power consumption. However, there are trade-offs between power consumption, channel impedance matching, channel timing, and voltage margins, etc. For example, as DC (direct current) voltage swing of signal generated by V-mode transmitter is improved (i.e., signal swing is made closer to swing rail to rail), pull-down impedance of the V-mode transmitter is generally reduced. However, a smaller pull-down impedance of the V-mode transmitter may result in channel impedance mismatch which causes signal reflections. In another example, equalization is applied to the signal driven by the V-mode transmitter to improve the width of the eye-diagram (formed from transmitting rising and falling signals by the V-mode transmitter). However, equalization (e.g., de-emphasis) may result in reducing signal swing when same data is repeatedly transmitted by the V-mode transmitter. Additionally, crosstalk noise from nearby signal lanes (i.e., near the V-mode transmitter signal lane of interest) may further degrade signal quality of the signal driven by the V-mode transmitter.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
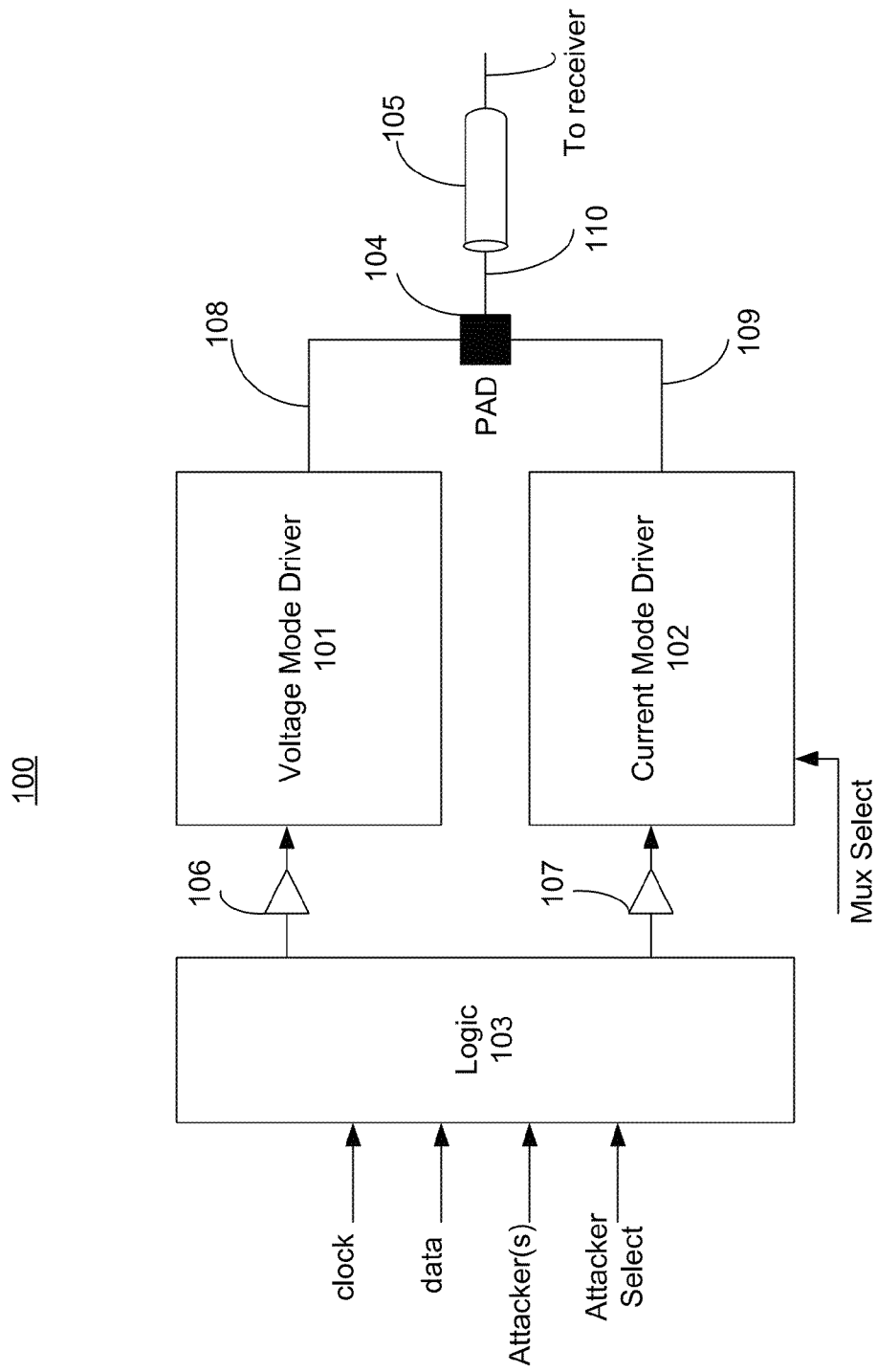
FIG. 1 is a high level architecture of a transmitter with voltage mode (V-mode) and current mode (I-mode) drivers, according to one embodiment of the disclosure.

The embodiments discuss a multi-purpose multi-mode input-output (I/O) transmitter that combines V-mode and I-mode drivers (or transmitters) to optimize performance of the I/O transmitter. The term "optimize" generally refers to improving performance of the I/O transmitter. For example, by lowering power consumption of the I/O transmitter while increasing signal swing to improve eye width and height, matching channel impedance, reducing or cancelling crosstalk, etc. In one embodiment, the I/O transmitter can also perform V-mode equalization to improve transmission of high data rate signals through lossy channels. The multi-purpose multi-mode I/O transmitter can be adapted for use in different types of I/O interfaces. For example, the embodiments can be used in double data rate (DDR) interfaces (including LPDDR4 (low power DDR4), LPDDR3 (low power DDR3), SXP, DDR3, DDR3L (DDR3 low power), DDR3U, DDR4, GDDR5 (Graphics double data rate 5), WIDEIO, etc.)

There are many technical effects of the embodiments. Some exemplary technical effects include: independent optimization of driver impedance and driver signal swing and driver optimization for different data rates, crosstalk cancellation or reduction to achieve higher timing margin and data rates, V-mode equalization with negligible increase in pad capacitance and area because the equalization feature uses existing driver pull-down legs to perform de-emphasis on output signal, allowing the driver to revert back to normal V-mode operation with minimal impact on pad capacitance, area, and power consumption.

The embodiments also allow combining various I/O performance optimization features together. For example, voltage mode driver feature, voltage mode equalization feature, current mode voltage swing boost feature, and current mode crosstalk cancellation feature, allow the embodiments to be adaptable to many different I/O interface types, channel conditions, data rates, etc.

For example, for long and lossy channels operating at higher data rates, transmitter voltage mode equalization feature may be enabled, but for the same channel when operating at lower data rates, transmitter voltage mode equalization feature may be disabled to save or conserve power consumption. In another example, for a channel with a lot of crosstalk, crosstalk feature of the current mode driver may be enabled. The embodiments, allow optimization of all these features to get the optimal power versus performance tradeoffs, because various features of the embodiments are adaptable. For example, pull-down impedance (Ron) and voltage signal swing can be optimized independently. Other technical effects will be evident from the embodiments discussed below.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal, or data/clock signal. The meaning of "a", "an", and "the" include plural references. The meaning of "in" includes in and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," etc., generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a high level architecture 100 of a transmitter with voltage mode (V-mode) and current mode (I-mode) drivers, according to one embodiment of the disclosure. In one embodiment, high level architecture 100 comprises a V-mode driver 101, I-mode driver 102, and logic 103. In one embodiment, output 108 of V-mode driver 101 and output 109 of I-mode driver 102 are electrically shorted at pad 104. The signal 110 at the output of pad 104 is transmitted to a receiver via transmission media (e.g., transmission line) 105. In one embodiment, logic 103 receives a plurality of signals including clock, data, one or more signals having information associated with attackers, and an attacker select signal. So as not to obscure the embodiments, other signals received by logic 103 are not illustrated. In one embodiment, logic 103 provides sampled data for V-mode driver 101 and I-mode driver 102 via buffers 106 and 107, respectively. In one embodiment, clock signal is used to sample the input data and signals associated with one or more attacker signals.

In one embodiment, V-mode driver 101 drives input data onto pad 104 as signal 108. The terms signal and node are interchangeably used to refer to physical node or signal being carried on that physical node. For example, identifier 108 may be used to refer to node 108 or signal 108, depending on the context. In one embodiment, V-mode driver 101 provides the output impedance (Rodt) which substantially matches the impedance of transmission line 105 (also called channel 105). In one embodiment, V-mode driver 101 also sets the pull-down impedance (Ron). In one embodiment, V-mode driver 101 is operable to perform equalization process on signal 108. For example, V-mode driver 101 is operable to de-emphasize signal 108 to improve transmission of high data rate signals through lossy channels.

In one embodiment, I-mode driver 102 operates in parallel to V-mode driver 101. In one embodiment, I-mode driver 102 receives the same input data as V-mode driver 101 and uses that input data to boost (i.e., improve or increase) voltage swing of signal 108 driven by V-mode driver 101. For example, in one embodiment, I-mode driver 102 sinks current from node 109 (shorted to node 108) to ground to lower the $V_{OL}$ (low voltage level) of signal 108. By lowering $V_{OL}$, signal swing of signal 108 increases because the DC voltage different between $V_{OL}$ and $V_{OH}$ (high voltage level) of signal 108 increases. In one embodiment, I-mode driver 102 sources current to node 109 (shorted to node 108) from power supply level (e.g., Vdd) to raise the $V_{OH}$ (high voltage level) of signal 108. For example, in one embodiment, I-mode driver 101 sources current to node 109 (shorted to node 108) from Vdd to raise the $V_{OH}$ high voltage level) of signal 108. By raising $V_{OH}$, signal swing of signal 108 increases because the DC voltage difference between $V_{OL}$ and $V_{OH}$ of signal 108 increases.

In one embodiment, I-mode driver 102 comprises a current sink apparatus which is operable to effectively source and sink currents to and from node 109. In such an embodiment, one of the current sink transistors is always turned on in normal operation and is turned off to cancel crosstalk caused by rising transition edge of an aggressor signal. In one embodiment, I-mode driver 102 comprises multiple current sink apparatuses. In such an embodiment, some of the current sinks are normally on and some of the current sinks are normally off. For example, when signal on pad 104 is being pulled down, a normally off current sink is enabled. In another example, when signal on pad 104 is being pulled up, the normally on current sink is disabled. This allows pad 104 to be pulled up and down using only pull down current sinks. In such an embodiment, one of the current sink transistors is always turned on in normal operation and is turned off to cancel crosstalk caused by rising transition edge of an aggressor signal.

In one embodiment, attacker select signal is used to select one or more attackers that cause the most crosstalk on signal 110. In such an embodiment, I-mode driver 102 effectively injects or sinks currents to or from node 109 during transition of the attacker signals. For example, if crosstalk from a falling edge attacker signal causes an overshoot on signal 110 during falling transition of the attacker signal, then I-mode driver 102 is operable to effectively sink current from node 109 during the falling transition of the attacker signal. In such an embodiment, crosstalk from signal 110 is reduced or completely cancelled. In another example, if crosstalk from a rising edge attacker signal causes an undershoot on signal 110 during rising transition of the attacker signal, then I-mode driver 102 is operable to effectively source current from node 109 during the rising transition of the attacker signal. In such an embodiment, the transistor of the current sink apparatus is turned off to cause an effective sourcing of current on node 110.

One benefit of combining V-mode and I-mode drivers together is that dependence of output impedance matching on output signal swing is decoupled from one another i.e., output impedance can be substantially matched to channel impedance without (or with substantially small) impact on output signal swing.

Figure 2:
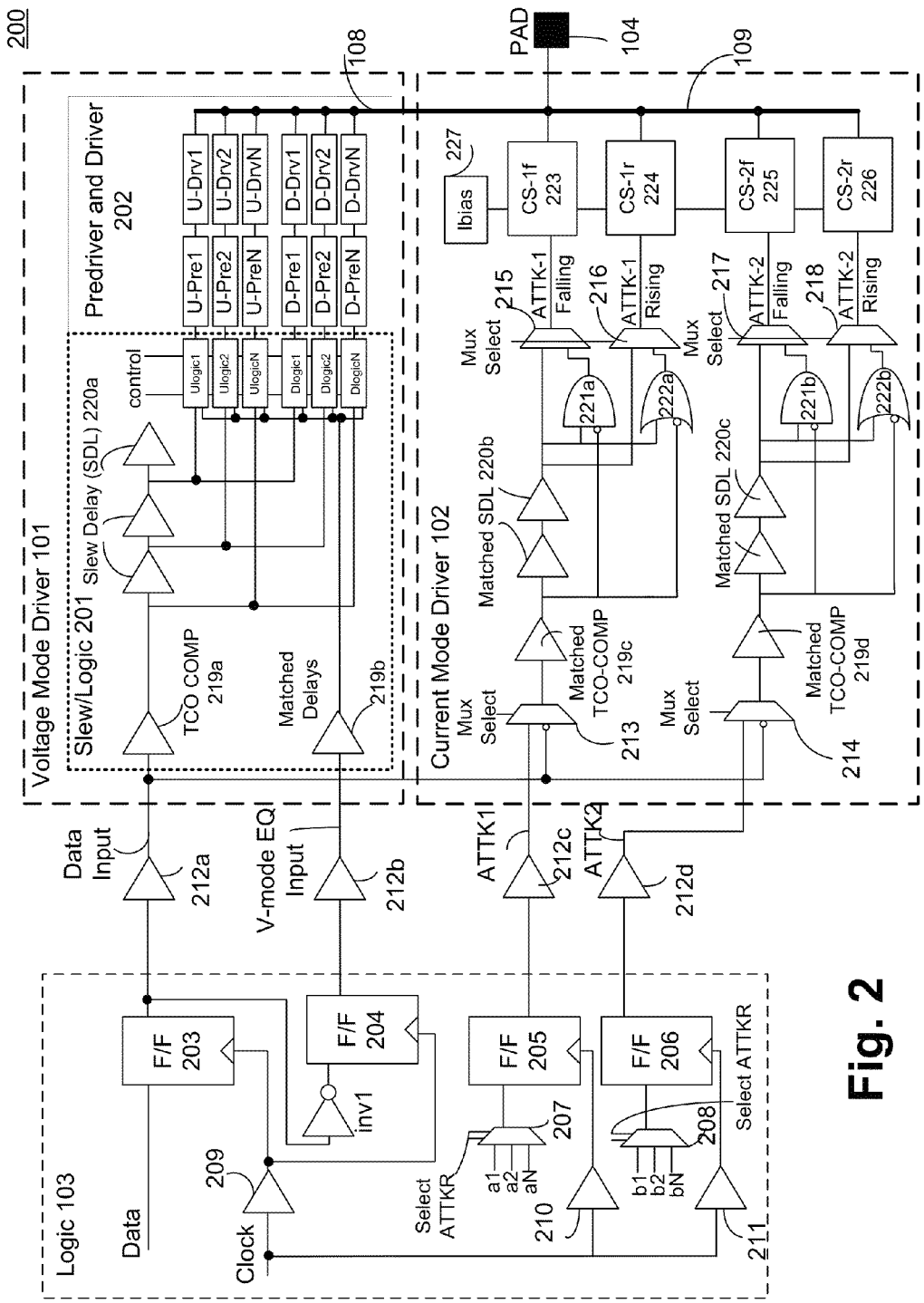
FIG. 2 is a low level architecture of the transmitter with V-mode and I-mode drivers, according to one embodiment of the disclosure.

FIG. 2 is a low level architecture 200 of the transmitter with V-mode and I-mode drivers, according to one embodiment of the disclosure. FIG. 2 is described with reference to FIG. 1. It is pointed out that those elements of FIG. 2 having the same reference numbers (or names) as the elements of any other figure can operate or function in any manner similar to that described, but are not limited to such.

In one embodiment, V-mode driver 101 comprises a slew rate control unit 201 coupled to pre-driver and driver units 202. In one embodiment, slew rate control unit 201 comprises TCO (rising edge vs. falling edge delay mismatch) compensation unit 219a which is used for adjusting rising edge vs. falling edge delay. In one embodiment, slew rate control unit 201 comprises slew rate delay (SDL) 220a buffers that are used for driving Up and Dn (Down) logic units—Ulogic1, Ulogic2, UlogicN, Dlogic1, Dlogic2, and DlogicN, where 'N' is an integer greater than two—for predriver and driver units 202. In one embodiment, Up and Dn logic units—Ulogic1, Ulogic2, UlogicN, Dlogic1, Dlogic2, and DlogicN—receive control signals to adjust driver strength of predriver and driver units 202 and to adjust impedance of driver unit (part of 202).

In one embodiment, V-mode driver 101 is operable to perform voltage equalization (EQ) to signal 108. In such an embodiment, V-mode EQ Input is received by slew rate logic unit 201. In one embodiment, when V-mode EQ is enabled, some driver legs are functionally switched from regular data driving legs to EQ legs. In such an embodiment, V-mode EQ Input is used to implement a de-emphasis feature on signal 108. One technical effect of de-emphasis is that the DC voltage swing of signal 108 reduces to add channel de-emphasis for high data rates when channel loss is significant (i.e., enough to cause a receiver to misread data without de-emphasis.) In one embodiment, V-mode EQ Input is delayed by buffer 219b having substantially the same delay as the delay of TCO compensation unit 219a. In one embodiment, output of buffer 219b (also called matched delay buffer) is received by Up and Dn logic units—Ulogic1, Ulogic2, UlogicN, Dlogic1, Dlogic2, and DlogicN.

In one embodiment, predriver and driver units 202 comprise Up and Down predrivers—U-Pre1, U-Pre2, U-PreN, D-Pre1, D-Pre2, D-PreN, where 'N' is an integer greater than 2—to drive a plurality of drivers. In one embodiment, the plurality of drivers include pull-up drivers—U-Drv1, U-Drv2, U-DrvN, where 'N' is an integer greater than two. In one embodiment, plurality of drivers include pull-down drivers—D-Drv1, D-Drv2, D-DrvN, where 'N' is an integer greater than two. In one embodiment, the output of pull-up and pull-down drivers drive voltage mode signal on node 109.

In one embodiment, I-mode driver 102 comprises multiplexers 213 and 214 which are operable (via Mux Select signal) to select one of Data Input or one of the attacker signals. In this exemplary embodiment, two attacker signals are shown—ATTK1 and ATTK2. The attacker signals or signals representing attacker signals are signals that cause crosstalk noise on victim signal 110. In other embodiments, more attackers can be added and corresponding logic to support those attackers can be included for cancelling crosstalk. In one embodiment, Data Input, V-Mode EQ Input, ATTK1, and ATTK2 are driven by buffers 212a, 212b, 212c, and 212d, respectively. In this embodiment, buffers 212a, 212b, 212c, and 212d have substantially the same propagation delay with respect to one another.

In one embodiment, I-mode driver 102 comprises buffers 219c and 219d to drive the outputs of multiplexers 213 and 214, respectively. In one embodiment, buffers 219c and 219d have propagation delays which are substantially the same as propagation delays of TCO compensation unit 219a i.e., the buffers 219c and 219d are delay matched to TCO compensation unit delay. In one embodiment, I-mode driver 102 comprises Matched SDL buffers 220b and 220c that emulate (or mimic) the propagation delay and slew rate characteristics of SDL buffers 220a of the V-mode driver 101.

In one embodiment, I-mode driver 102 comprises pulse generation logic units. In one embodiment, a first pulse generation logic unit is used for generating a pulse indicating falling edge transition of ATTK1 signal. In one embodiment, an AND gate 221a (or an equivalent logic using NAND gate) is used for generating the pulse indicating falling edge transition of ATTK1 signal. In one embodiment, the width of the pulse can be adjusted by adjusting propagation delay of Matched SDL buffers 220b. In one embodiment, pulse is generated by providing a delayed version of ATTK1 signal via Matched SDL buffers 220b and a non-delayed version of ATTK1 signal via output of buffer 219c. In this embodiment, the non-delayed version of ATTK1 signal is inverted before the AND operation by AND gate 221a. Other pulse generation logics may also be used to generate pulse indicating falling edge transition of ATTK1 (also referred as ATTK-1 falling) signal.

In one embodiment, a second pulse generation logic unit is used for generating a pulse indicating rising edge transition of ATTK1 signal. In one embodiment, an OR gate 222a (or an equivalent logic with NOR gate) is used for generating the pulse indicating rising edge transition of ATTK1 signal. In one embodiment, the width of the pulse can be adjusted by adjusting propagation delay of Matched SDL buffers 220b. In one embodiment, the pulse is generated by providing a delayed version of ATTK1 signal via Matched SDL buffers 220b and a non-delayed version of ATTK1 signal via output of buffer 219c. In this embodiment, the non-delayed version of ATTK1 signal is inverted before the OR operation by OR gate 222a. Other pulse generation logics may also be used to generate pulse indicating rising edge transition of ATTK1 signal.

In one embodiment, a third pulse generation logic unit is used for generating a pulse indicating falling edge transition of ATTK2 signal. In one embodiment, an AND gate 221b (or an equivalent logic using NAND gate) is used for generating the pulse indicating falling edge transition of ATTK2 signal. In one embodiment, the width of the pulse can be adjusted by adjusting propagation delay of Matched SDL buffers 220c. In one embodiment, pulse is generated by providing a delayed version of ATTK2 signal via Matched SDL buffers 220c and a non-delayed version of ATTK2 signal via output of buffer 219d. In this embodiment, the non-delayed version of ATTK2 signal is inverted before the AND operation by AND gate 221b. Other pulse generation logics may also be used to generate pulse indicating falling edge transition of ATTK2 signal.

In one embodiment, a fourth pulse generation logic unit is used for generating a pulse indicating rising edge transition of ATTK2 signal. In one embodiment, an OR gate 222b (or an equivalent logic with NOR gate) is used for generating the pulse indicating rising edge transition of ATTK2 signal. In one embodiment, the width of the pulse can be adjusted by adjusting propagation delay of Matched SDL buffers 220c. In one embodiment, the pulse is generated by providing a delayed version of ATTK2 signal via Matched SDL buffers 220c and a non-delayed version of ATTK2 signal via output of buffer 219d. In this embodiment, the non-delayed version of ATTK2 signal is inverted before the OR operation by OR gate 222b. Other pulse generation logics may also be used to generate pulse indicating rising edge transition of ATTK2 signal.

In one embodiment, I-mode driver 102 comprises a first multiplexer 215 which is operable (via Mux Select signal) to select one of Data Input or pulse signal which indicates falling edge of ATTK1 signal. While the output of first multiplexer 215 is labeled "ATTK-1 Falling," its properties depend on the Mux Select signal. For example, if Mux Select signal causes first multiplexer 215 to select Data Input, then "ATTK-1 Falling" represents Data Input which is also driven by V-Mode driver 101. In such an embodiment, voltage swing adjustment (e.g., by lowering of $V_{OL}$ of signal 108) is performed by I-mode driver 102. Otherwise, if Mux Select signal causes first multiplexer 215 to select the output of AND gate 221a, then "ATTK-1 Falling" indicates falling edge of ATTK1 signal. In such an embodiment, crosstalk cancellation or reduction on signal 108 is performed by I-mode driver 102, where crosstalk being induced by ATTK1 signal (or signal representing ATTK1) during its falling edge.

In one embodiment, I-mode driver 102 comprises a second multiplexer 216 which is operable (via Mux Select signal) to select one of Data Input or pulse signal which indicates rising edge of ATTK1 signal. While the output of second multiplexer 216 is labeled "ATTK-1 Rising," its properties depend on the Mux Select signal. For example, if Mux Select signal causes second multiplexer 216 to select Data Input, then "ATTK-1 Rising" represents Data Input which is also driven by V-Mode driver 101. In such an embodiment, voltage swing adjustment (e.g., by lowering of $V_{OL}$ of signal 108) is performed by I-mode driver 102. Otherwise, if Mux Select signal causes second multiplexer 216 to select the output of OR gate 222a, then "ATTK-1 Rising" indicates rising edge of ATTK1 signal. In such an embodiment, crosstalk cancellation or reduction on signal 108 is performed by I-mode driver 102, where crosstalk being induced by ATTK1 signal (or signal representing ATTK1) during its rising edge.

In one embodiment, I-mode driver 102 comprises a third multiplexer 217 which is operable (via Mux Select signal) to select one of Data Input or pulse signal which indicates falling edge of ATTK2 signal. While the output of third multiplexer 217 is labeled "ATTK-2 Falling," its properties depend on the Mux Select signal. For example, if Mux Select signal causes third multiplexer 217 to select Data Input, then "ATTK-2 Falling" represents Data Input which is also driven by V-Mode driver 101. In such an embodiment, voltage swing adjustment (e.g., by lowering of $V_{OL}$ of signal 108) is performed by I-mode driver 102. Otherwise, if Mux Select signal causes third multiplexer 217 to select the output of AND gate 221b, then "ATTK-2 Falling" indicates falling edge of ATTK2 signal. In such an embodiment, crosstalk cancellation or reduction on signal 108 is performed by I-mode driver 102, where crosstalk being induced by ATTK2 signal (or signal representing ATTK2) during its falling edge.

In one embodiment, I-mode driver 102 comprises a fourth multiplexer 218 which is operable (via Mux Select signal) to select one of Data Input or pulse signal which indicates rising edge of ATTK2 signal. While the output of fourth multiplexer 218 is labeled "ATTK-2 Rising," its properties depend on the Mux Select signal. For example, if Mux Select signal causes fourth multiplexer 218 to select Data Input, then "ATTK-2 Rising" represents Data Input which is also driven by V-Mode driver 101. In such an embodiment, voltage swing adjustment (e.g., by lowering of $V_{OL}$ of signal 108) is performed by I-mode driver 102. Otherwise, if Mux Select signal causes fourth multiplexer 218 to select the output of OR gate 222b, then "ATTK-2 Rising" indicates rising edge of ATTK2 signal. In such an embodiment, crosstalk cancellation or reduction on signal 108 is performed by I-mode driver 102, where crosstalk being induced by ATTK2 signal (or signal representing ATTK2) during its rising edge.

In one embodiment, I-mode driver 102 comprises a current source(s) coupled to output node 109. In one embodiment, output of first multiplexer 215 is received by first current source 223 (also referred as CS-1f). In one embodiment, output of second multiplexer 216 is received by second current source 224 (also referred as CS-1r). In one embodiment, output of third multiplexer 217 is received by third current source 225 (also referred as CS-2f). In one embodiment, output of fourth multiplexer 218 is received by fourth current source 226 (also referred as CS-2r). In one embodiment, all current sources (223-226) are current sinks i.e., there are no separate current sources to source current to pad 104.

In one embodiment, each of current sinks (223-226) is operable to be switched on or off. In one embodiment, when I-mode driver 102 is enabled for voltage swing boost (via Mux Select signal), current sinks (223-226) are disabled. In such an embodiment, data is logically high. In one embodiment, when I-mode driver 102 is enabled for voltage swing boost (via Mux Select signal), current sinks (223-226) are enabled (i.e., turned on). In such an embodiment, data is logically low. In this embodiment, the low level of signal 108 (i.e., $V_{OL}$ of signal 108) is effectively reduced while the high level of signal 108 is left unchanged.

In one embodiment, when I-mode driver 102 is enabled for crosstalk reduction or cancellation (via Mux Select signal) positive and negative currents induced on signal 108 by attacker signals are reduced or cancelled. These positive and negative currents are induced by inductive crosstalk events of rising and falling edges of an aggressor signal. In one embodiment, both positive and negative currents are cancelled or reduced by segmenting the current source into segments. In this example, the current source is segmented into four segments—CS-1f 223, CS-1r 224, CS-2f 225, CS-2r 226. In one embodiment, each aggressor signal (or signal representing that aggressor signal) controls at least two of the current sinks. For example, ATTK1 signal is received in pulse form by current sinks CS-1f and CS-1r, and ATTK2 signal is received in pulse form by current sinks CS-2f and CS-2r. While the embodiments illustrate a current source as being a current sink, current sources can be implemented as true current sources that add current to node 109 instead of sinking current from node 109.

In one embodiment, logic (not explicitly shown) in each CS, may enable crosstalk cancellation of one aggressor (e.g., ATTK1) while using the other set (in this embodiment for ATTK2) to do swing boost. In such an embodiment, Mux Select signal for multiplexers 213, 215 and 216 is decoupled from Mux Select signal for multiplexers 214, 217, and 218 i.e., Mux Select signal for multiplexers 213, 215 and 216 is different from Mux Select signal for multiplexers 214, 217, and 218. In one embodiment, I-mode driver 102 is completely disabled for I/O interfaces that do not require features of crosstalk cancellation and signal swing boost. In one embodiment, strength of swing boost by I-mode driver 102 is adjustable by adjusting the effecting strength of transistors in the current sources 223, 224, 225, and 226. In one embodiment, strength of swing boost and/or crosstalk cancellation (or reduction) features can be optimized for optimal performance/power tradeoffs. In one embodiment, multiplexers 213, 215, and 216 are controlled by the same multiplexer select signal (first Mux Select signal). In one embodiment, multiplexers 214, 217, and 218 are controlled by the same multiplexer select signal (second Mux Select signal). In one embodiment, first and second Mux Select signals are the same signals. In another embodiment, first and second Mux Select signals are different signals.

In one embodiment, each of the current sources (223-226) receives bias signal from bias generator 227 (also referred as Ibias). In one embodiment, Ibias is a voltage bias signal. In one embodiment, bias generator 227 is a bandgap generator. In one embodiment, bias generator 227 is a voltage divider. For example, voltage divider is a resistor divider network from either transistors or resistors or combination of both. In one embodiment, output of bias generator 227 is an analog signal. For example, output of bias generator 227 is 0.5V. In one embodiment, Ibias (i.e., bias generator) 227 is digital bias.

In one embodiment, Logic 103 comprises a first sequential unit 203 (e.g., a flip-flop (F/F)) to sample input Data signal. In one embodiment, output of first sequential unit 203 is received by buffer 212a. In one embodiment, output of first sequential unit 203 is inverted by inv1 and then sampled by second sequential unit 204. In one embodiment, output of second sequential unit 204 is received by buffer 212b.

In one embodiment, logic 103 comprises multiplexer 207 which is operable (via Select ATTKR signal) to select one of the first attacker signals (or signals representing attacker signals) a1-aN, where 'N' is an integer greater than two. In one embodiment, output of multiplexer 207 is sampled by third sequential unit 205 to generate output for buffer 212c. In one embodiment, Logic 103 comprises multiplexer 208 which is operable (via Select ATTKR signal) to select one of the second attacker signals (or signals representing attacker signals) b1-bN, where 'N' is an integer greater than two. In one embodiment, output of multiplexer 208 is sampled by fourth sequential unit 206 to generated output for buffer 212d. In one embodiment, sequential units (203-206) sample input signals via Clock signal. In one embodiment, clock buffers 209, 210, and 211 are added so that each of the sequential units (203-206) receive substantially the same clock signal. In this embodiment, clock skew is reduced.

Figure 3:
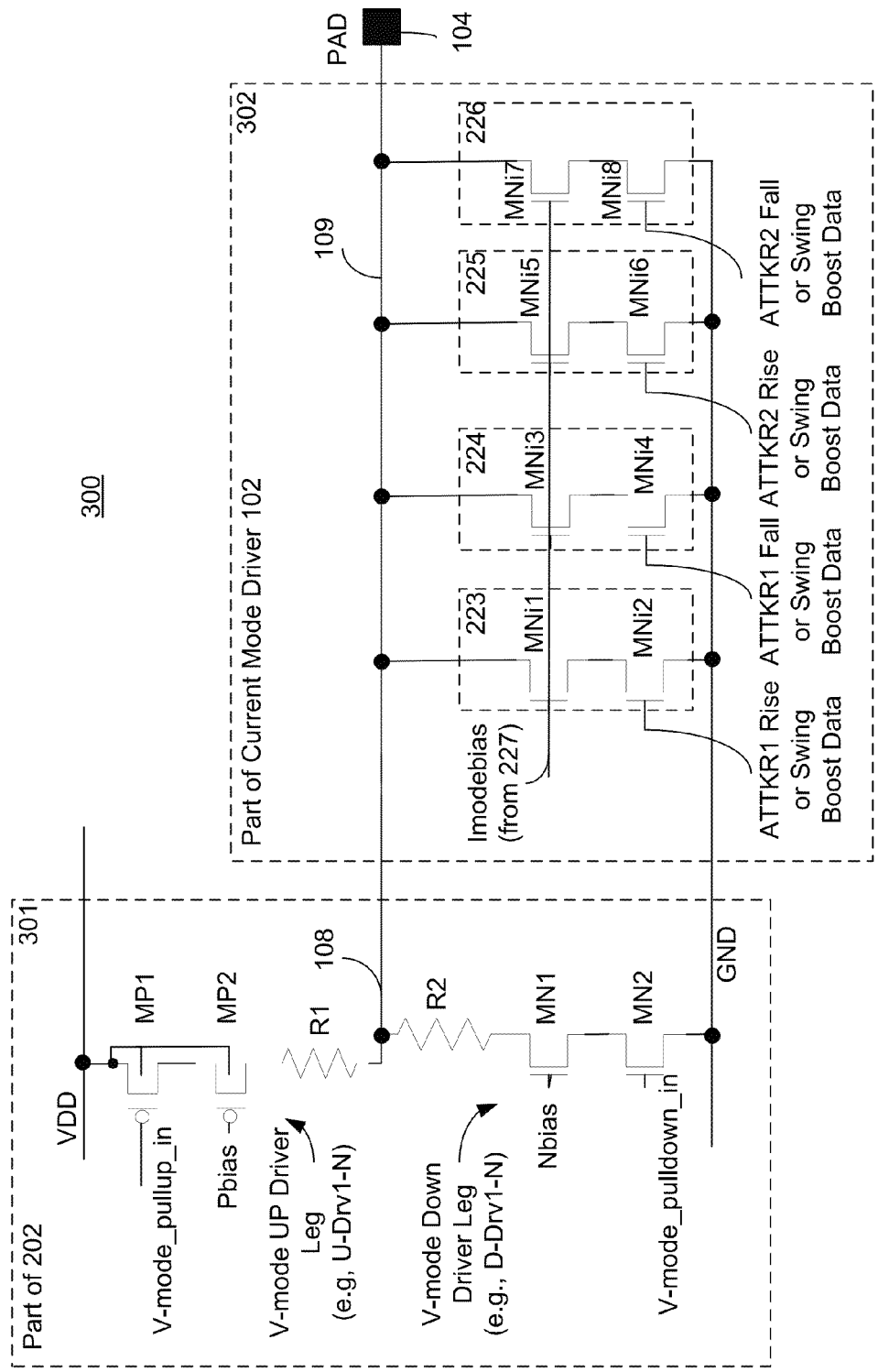
FIG. 3 is a circuit level view of V-mode and I-mode drivers, according to one embodiment of the disclosure.

FIG. 3 is a circuit 300 of V-mode and I-mode drivers, according to one embodiment of the disclosure. It is pointed out that those elements of FIG. 3 having the same reference numbers (or names) as the elements of any other figure can operate or function in any manner similar to that described, but are not limited to such.

In one embodiment, circuit 300 comprises a V-mode driver section 301 (e.g., U-DrvN and D-DrvN of FIG. 2) and I-mode driver section 302 (e.g., CS-1f 223, CS-1r 224, CS-2f 225, and CS-2r 226 of FIG. 2). In one embodiment, V-mode driver section 301 comprises a pull-up driver (also referred as V-mode UP driver) which includes switchable p-type device MP1 coupled in series to biased p-type device MP2 which is coupled in series with a resistive device R1 (e.g., resistor or transistor operable as a resistor). In one embodiment, MP1 is controllable by Vmode_pullup_in signal (provided by U-PreN predriver of FIG. 2). The drain terminal of MP1 is coupled to source terminal of MP2 while source terminal of MP1 is coupled to power supply (VDD). In one embodiment, MP2 is biased by Pbias signal, which along with resistive device R1 determines the pull-up impedance of V-mode driver section 301. In one embodiment, one end of resistive device R1 is coupled to drain terminal of MP2 while the other end of resistive device R1 is coupled to node 108.

In one embodiment, V-mode driver section 301 comprises a pull-down driver (also referred as V-mode Down driver) which includes switchable n-type device MN2 coupled in series to biased n-type device MN1, which is coupled in series with a resistive device R2 (e.g., resistor or transistor operable as a resistor). In one embodiment, MN2 is controllable by Vmode_pulldown_in signal (provided by D-PreN predriver). The drain terminal of MN2 is coupled to source terminal of MN1 while source terminal of MN2 is coupled to ground (GND). In one embodiment, MN2 is biased by Nbias signal, which along with resistive device R2 determines the pull-down impedance of V-mode driver section 301. In one embodiment, one end of resistive device R2 is coupled to drain terminal of MN1 while the other end of R2 is coupled to node 108.

In one embodiment, I-mode driver section 302 comprises current sink 223 which includes an n-type MNi1 biased by Imodebias (from 227), where MNi1 is coupled in series with n-type MNi2. In one embodiment, MNi2 is controllable by output of multiplexer 215. Depending on the Mux Select signal, the gate terminal of MNi2 receives either data input or pulse signal representing falling edge of ATTK1 signal. In one embodiment, source terminal of MNi2 is coupled to GND while drain terminal of MNi2 is coupled to source terminal of MNi1. In one embodiment, drain terminal of MNi1 is coupled to node 108 (same as node 109), which is coupled to PAD 104.

In one embodiment, I-mode driver section 302 comprises current sink 224 which includes an n-type MNi3 biased by Imodebias (from 227), where MNi3 is coupled in series with n-type MNi4. In one embodiment, MNi4 is controllable by output of multiplexer 216. Depending on the Mux Select signal, the gate terminal of MNi4 receives either data input or pulse signal representing rising edge of ATTK1 signal. In one embodiment, source terminal of MNi4 is coupled to GND while drain terminal of MNi4 is coupled to source terminal of MNi3. In one embodiment, drain terminal of MNi3 is coupled to node 108 (same as node 109), which is coupled to PAD 104.

In one embodiment, I-mode driver section 302 comprises current sink 225 which includes an n-type MNi5 biased by Imodebias (from 227), where MNi5 is coupled in series with n-type MNi6. In one embodiment, MNi6 is controllable by output of multiplexer 217. Depending on the Mux Select signal, the gate terminal of MNi6 receives either data input or pulse signal representing falling edge of ATTK2 signal. In one embodiment, source terminal of MNi6 is coupled to GND while drain terminal of MNi6 is coupled to source terminal of MNi5. In one embodiment, drain terminal of MNi5 is coupled to node 108 (same as node 109), which is coupled to PAD 104.

In one embodiment, I-mode driver section 302 comprises current sink 226 which includes an n-type MNi7 biased by Imodebias (from 227), where MNi7 is coupled in series with n-type MNi8. In one embodiment, MNi8 is controllable by output of multiplexer 218. Depending on the Mux Select signal, the gate terminal of MNi8 receives either data input or pulse signal representing rising edge of ATTK2 signal. In one embodiment, source terminal of MNi8 is coupled to GND while drain terminal of MNi8 is coupled to source terminal of MNi7. In one embodiment, drain terminal of MNi7 is coupled to node 108 (same as node 109), which is coupled to PAD 104.

In one embodiment, one of the two current sinks is normally off and switches on during a low to high edge transition of aggressor signal. For example, the current sinks (224 and 226) that receive falling edge attacker signals are normally off. In one embodiment, one of the current sink is normally on and switches off during an aggressor low to high transition. For example, current sinks (223 and 225) that receive rising edge attacker signals are normally on.

Novelty of using a single polarity of current source (e.g., current sink only or current source only) is to provide effects of both polarities of current source. A transistor based current source may not work well as a current source unless there is a at least a minimum voltage across it. Thus, a supply terminated bus may not have a good pull-up current source and a ground terminated bus may not have a good pull-down current source. To use an I/O driver for various supply terminated I/O interfaces (DDR4, for example), crosstalk cancellation feature may not be implemented with a pull-up and pull-down current source since the pull-up current source may not have enough voltage across it.

In one embodiment, architecture 100 allows crosstalk cancellation that would not have been feasible with a pull-up current source. In one embodiment, architecture 100 may be used in a VSS terminated I/O interface. In such an embodiment, instead of using n-type current sources coupled to ground (as shown by current sinks 223, 224, 225, and 226), p-type current sources only coupled to the supply may be used. In such an embodiment, I-mode driver section 302 is flipped (in terms of structure) from being n-type to ground based current sinks to a p-type to supply based current sources.

Figure 4:
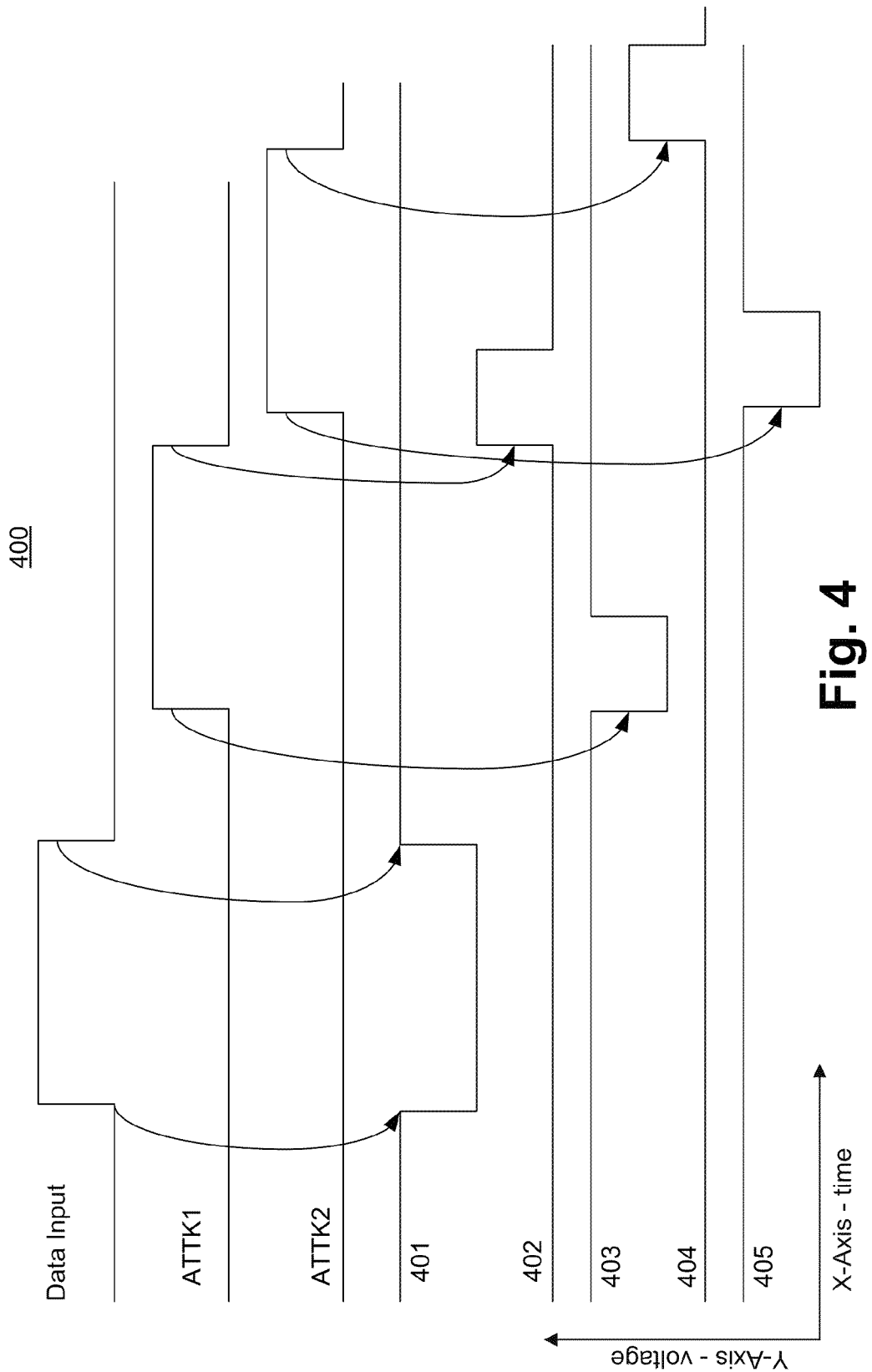
FIG. 4 is a set of waveforms illustrating operation of V-mode and I-mode drivers, according to one embodiment of the disclosure.

FIG. 4 is a set of waveforms 400 illustrating operation of V-mode and I-mode drivers, according to one embodiment of the disclosure. It is pointed out that those elements of FIG. 4 having the same reference numbers (or names) as the elements of any other figure can operate or function in any manner similar to that described, but are not limited to such.

The x-axis is time and the y-axis is voltage. The first waveform from the top is Data Input signal, the second waveform from the top is ATTK1 signal (i.e., signal representing attacker number 1), and the third waveform from the top is ATTK2 signal (i.e., signal representing attacker number 2). In one embodiment, when the Mux Select signal for multiplexers 213, 214, 215, 216, 217, and 218 is selected to boost voltage swing of signal 108, Data Input signal is inverted (see bubble representing inversion before multiplexers 213 and 214 receive Date Input). The inverted Data Input is shown by waveform 401. Waveform 401 causes the signal 108 to have a lower $V_{OL}$.

In one embodiment, when the Mux Select signal for multiplexers 213, 214, 215, 216, 217, and 218 is selected to cancel or reduce crosstalk on signal 108, pulse signals indicating rising and falling edges of the attacker signals are used for controlling (i.e., to switch on or off) the current sinks (223-226). In this example, waveform 402 indicates the pulse generated by the falling edge of ATTK1 signal. Waveform 403 indicates the pulse generated by the rising edge of ATTK1 signal. Waveform 404 indicates the pulse generated by the falling edge of ATTK2 signal. Waveform 405 indicates the pulse generated by the rising edge of ATTK2 signal. In one embodiment, the width of the pulse is programmable. In one embodiment, the width of the pulse is approximately 100 ps. In other embodiments, other widths may be used. Waveforms 403, 405 are mostly high, which means that current sinks receiving these signals are normally on.

Figure 5:
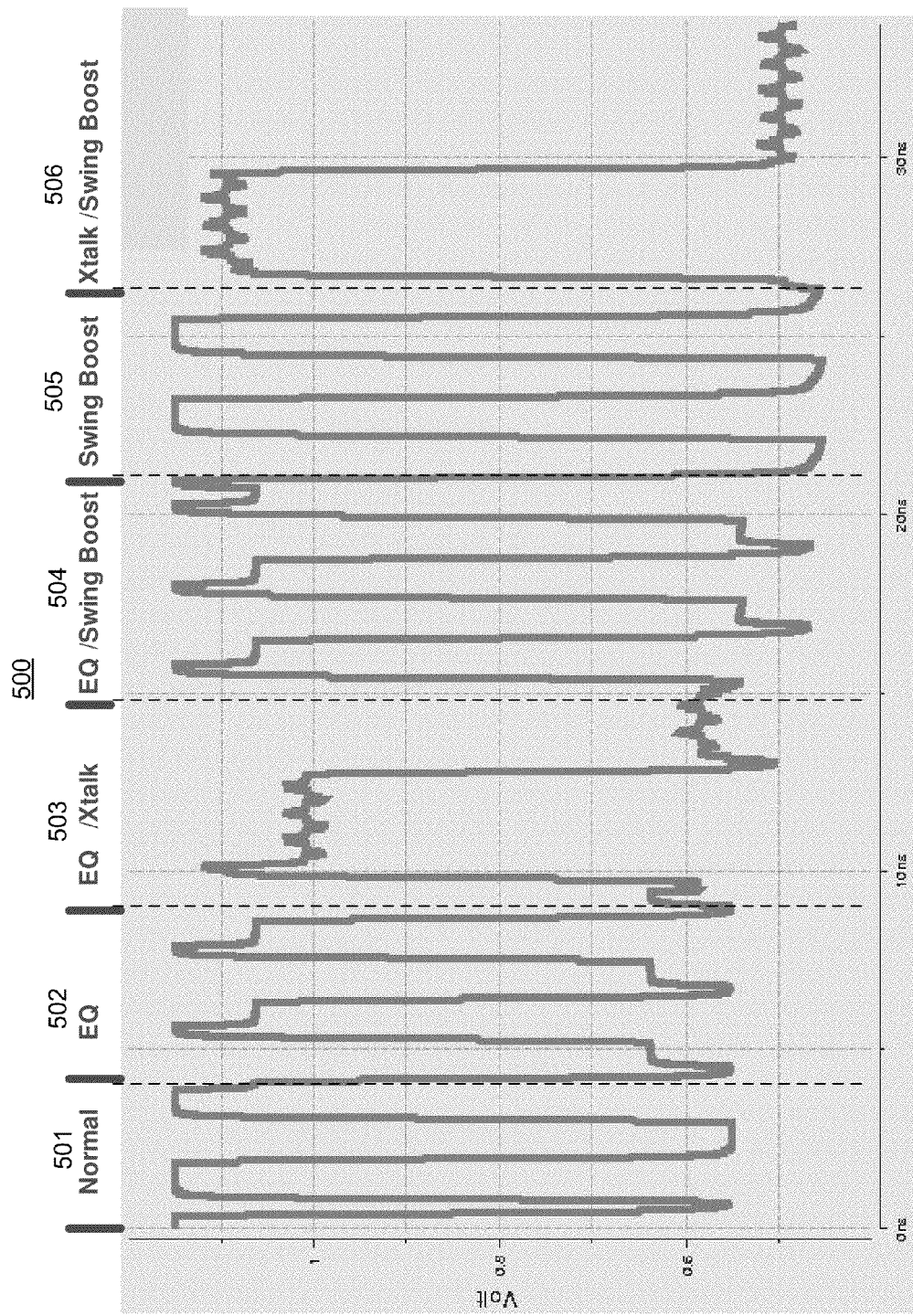
FIG. 5 is a waveform illustrating various features of the V-mode and I-mode drivers, according to one embodiment of the disclosure.

FIG. 5 is a waveform 500 illustrating various features of the V-mode and I-mode drivers, according to one embodiment of the disclosure. It is pointed out that those elements of FIG. 5 having the same reference numbers (or names) as the elements of any other figure can operate or function in any manner similar to that described, but are not limited to such.

The x-axis is time and the y-axis is voltage. Waveform 500 is signal on pad 104. Section 501 of waveform 500 indicates normal operation of V-mode driver 101 when I-mode driver 102 is disabled. Section 502 of waveform 500 indicates V-mode EQ which de-emphasizes the signal to reduce inter-symbol interference (ISI) caused by high data rates and lossy channel. Section 502 of waveform 500 is generated when I-mode driver 102 is disabled. Section 503 of waveform 500 indicates the case when V-mode EQ is enabled and I-mode driver 102 is enabled to reduce or cancel crosstalk on signal 108. In this example, I-mode driver 102 is enabled. In this example, V-mode EQ causes signal on pad 104 to be de-emphasized while I-mode driver 102 introduces pulses of currents to signal 108 to reduce or cancel crosstalk from attackers.

Section 504 of waveform 500 indicates the case when I-mode driver 102 is enabled to boost voltage swing and V-mode driver 101 is operable to be in EQ mode. In this example, EQ causes signal 108 to de-emphasize while I-mode driver 102 causes the low level portion of waveform 500 to further lower down i.e., lowers $V_{OL}$ of signal 108 to increase voltage swing of signal 108. Section 505 of waveform 500 indicates the case when EQ feature of V-mode driver 101 is disabled while I-mode driver 102 is set to boost signal swing of signal 108. In this example, I-mode driver 102 causes the low level portion of waveform 500 to further lower down i.e., lowers $V_{OL}$ of signal 108 to increase voltage swing of signal 108. Section 506 of waveform 500 indicates the case when crosstalk cancellation feature and signal boost feature is enabled. In this case, the feature for cancelling crosstalk from a single aggressor signal is enabled and signal swing boost feature is enabled concurrently.

Figure 6:
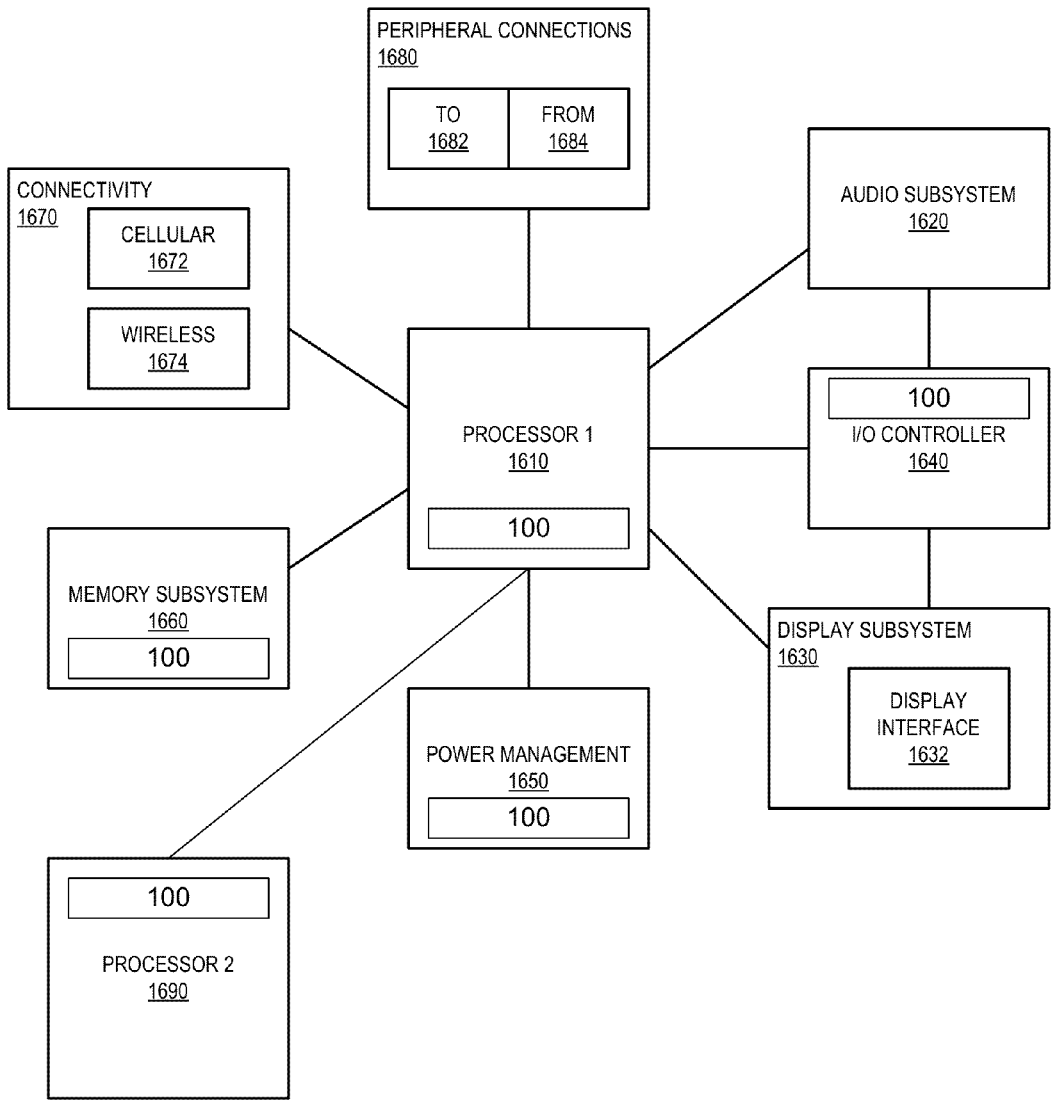
FIG. 6 is a smart device or a computer system or a SOC (system on chip) with the transmitter with V-mode and I-mode drivers, according to one embodiment of the disclosure.

FIG. 6 is a smart device or a computer system or a SOC (system on chip) with the transmitter with V-mode and I-mode drivers, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with architecture 100 (having V-mode and I-mode drivers 101 and 102 respectively), according to the embodiments discussed. Other blocks of the computing device 1600 may also include architecture 100 (having V-mode and I-mode drivers 101 and 102 respectively). The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an integrated circuit (IC) comprises: an I/O pad for coupling to a transmission line; a voltage mode driver coupled to the I/O pad, the voltage mode driver having a pull-up driver and a pull-down driver; and a current mode driver coupled to the I/O pad, the current mode driver operable to function in parallel to the voltage mode driver.

In one embodiment, the current mode driver comprises a switchable current sink coupled in parallel to the pull-down driver of the voltage mode driver. In one embodiment, the switchable current sink comprises a plurality of transistors coupled in parallel to one another. In one embodiment, the current mode driver is operable to boost signal swing of signal driven by the voltage mode driver.

In one embodiment, the current mode driver is operable to cancel crosstalk from a signal driven by the voltage mode driver. In one embodiment, the current mode driver comprises a multiplexer which is operable to provide a data input signal which is also provided to the voltage mode driver. In one embodiment, the multiplexer is operable to provide signal information of one or more attackers to the current mode driver for crosstalk cancellation, with the one or more attackers attacking a signal driven on the transmission line.

In one embodiment, the IC further comprises logic to select signals associated with the one or more attackers, the selected signals to be provided to the multiplexer. In one embodiment, the IC further comprises a pulse generator which is coupled to the multiplexer. In one embodiment, the voltage mode driver comprises a voltage mode equalizer for deemphasizing a signal driven on the transmission line.

In one embodiment, the voltage mode driver comprises a slew rate adjustment circuit for adjusting slew rate of a signal driven on the transmission line. In one embodiment, the voltage mode driver which comprises an on-die termination.

In another example, in one embodiment, a driver comprises: a voltage mode driver which is operable to deemphasize a signal driven by the voltage mode driver on to a transmission line coupled to the voltage mode driver via an I/O pad; and a current mode driver with a switchable current source and operable to: adjusting the signal swing of the signal driven by the voltage mode driver, and reducing crosstalk from the signal driven by the voltage mode driver.

In one embodiment, the switchable current source is a switchable current sink with a plurality of n-type devices coupled in parallel to one another. In one embodiment, the current mode driver is operable to receive signal information associated with signals driven on transmission lines adjacent to the transmission line. In one embodiment, the current mode driver is operable to receive data input which is also received by the voltage mode driver.

In another example, in one embodiment, a system comprises: a memory; a processor, coupled to the memory, the processor having an I/O driver, the I/O driver including: an I/O pad for coupling to a transmission line; a voltage mode driver coupled to the I/O pad, the voltage mode driver having a pull-up driver and a pull-down driver; and a current mode driver coupled to the I/O pad, the current mode driver operable to function in parallel to the voltage mode driver; and a wireless interface for communicatively coupling the processor with another device; and a display unit for displaying information processed by the processor.

In one embodiment, the current mode driver comprises a switchable current sink coupled in parallel to the pull-down driver of the voltage mode driver. In one embodiment, the current mode driver is operable to boost signal swing of a signal driven by the voltage mode driver. In one embodiment, the current mode driver is operable to cancel crosstalk from a signal driven by the voltage mode driver.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) comprising:
   an input-output (I/O) pad for coupling to a transmission line;
   a voltage mode driver coupled to the I/O pad, the voltage mode driver including:
      a pull-up driver;
      a pull-down driver;
      a slew rate adjustment circuit for adjusting slew rate of a signal to be driven on the transmission line; and
      an on-die termination; and
   a current mode driver coupled to the I/O pad, the current mode driver operable to:
      function in parallel to the voltage mode driver, and
      receive data input which is also received by the voltage mode driver.

2. The IC of claim 1, wherein the current mode driver comprises a switchable current sink coupled in parallel to the pull-down driver of the voltage mode driver.

3. The IC of claim 2, wherein the switchable current sink comprises a plurality of transistors coupled in parallel to one another.

4. The IC of claim 1, wherein the current mode driver is operable to boost signal swing of the signal driven by the voltage mode driver.

5. The IC of claim 1, wherein the current mode driver is operable to cancel crosstalk from the signal driven by the voltage mode driver.

6. The IC of claim 1, wherein the current mode driver comprises a multiplexer which is operable to provide the data input which is also provided to the voltage mode driver.

7. The IC of claim 6, wherein the multiplexer is operable to provide signal information of one or more attackers to the current mode driver for crosstalk cancellation, the one or more attackers attacking signal driven on the transmission line.

8. The IC of claim 7 further comprises logic to select signals associated with the one or more attackers, the selected signals to be provided to the multiplexer.

9. The IC of claim 6 further comprises a pulse generator coupled to the multiplexer.

10. The IC of claim 1, wherein the voltage mode driver comprises a voltage mode equalizer for deemphasizing the signal driven on the transmission line.

11. The IC of claim 1, wherein the slew rate adjustment circuit is coupled to a pre-driver.

12. A driver comprising:
   a voltage mode driver which is operable to deemphasize a signal driven by the voltage mode driver on to a transmission line coupled to the voltage mode driver via an input-output (I/O) pad, wherein the voltage mode driver includes a slew rate adjustment circuit for adjusting slew rate of a signal to be driven on the transmission line; and
   a current mode driver with a switchable current source and operable to:
      adjust signal swing of the signal driven by the voltage mode driver, and
      reduce crosstalk from the signal driven by the voltage mode driver, wherein the current mode driver is operable to receive data input which is also received by the voltage mode driver.

13. The driver of claim 12, wherein switchable current source is a switchable current sink with a plurality of n-type devices coupled in parallel to one another.

14. The driver of claim 12, wherein the current mode driver comprises a multiplexer which is operable to provide the data input which is also provided to the voltage mode driver.

15. A system comprising:
   a memory;
   a processor, coupled to the memory, the processor having an input-output (I/O) driver, the I/O driver including:
      an I/O pad for coupling to a transmission line;
   a voltage mode driver coupled to the I/O pad, the voltage mode driver including:
      a pull-up driver;
      a pull-down driver; and
      a slew rate adjustment circuit for adjusting slew rate of a signal to be driven on the transmission line; and
      an on-die termination; and
   a current mode driver coupled to the I/O pad, the current mode driver operable to:
      function in parallel to the voltage mode driver, and
      receive data input which is also received by the voltage mode driver;
   a wireless interface for communicatively coupling the processor with another device; and
   a display interface for displaying information processed by the processor.

16. The system of claim 15, wherein the current mode driver comprises a switchable current sink coupled in parallel to the pull-down driver of the voltage mode driver.

17. The system of claim 15, wherein the current mode driver is operable to boost signal swing of the signal driven by the voltage mode driver.

18. The system of claim 15, wherein the current mode driver is operable to cancel crosstalk from the signal driven by the voltage mode driver.

* * * * *